United States Patent
Giduturi

(10) Patent No.: US 11,348,637 B2
(45) Date of Patent: May 31, 2022

(54) ELECTRICAL DISTANCE-BASED REMAPPING IN A MEMORY DEVICE

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 17/008,254

(22) Filed: Aug. 31, 2020

(65) Prior Publication Data

US 2022/0068376 A1 Mar. 3, 2022

(51) Int. Cl.
*G11C 16/10* (2006.01)
*G11C 13/00* (2006.01)
*G06F 3/06* (2006.01)

(52) U.S. Cl.
CPC .......... *G11C 13/003* (2013.01); *G06F 3/0604* (2013.01); *G06F 3/0655* (2013.01); *G06F 3/0671* (2013.01); *G11C 13/0026* (2013.01); *G11C 13/0028* (2013.01)

(58) Field of Classification Search
CPC .............. G11C 13/003; G11C 13/0026; G11C 13/0028; G06F 3/0604; G06F 3/0655; G06F 3/0671
See application file for complete search history.

(56) References Cited

U.S. PATENT DOCUMENTS

| | | |
|---|---|---|
| 2008/0162802 A1 | 7/2008 | Akiyama et al. |
| 2009/0175081 A1 | 7/2009 | Kim |
| 2010/0157656 A1* | 6/2010 | Tsuchida ............ G11C 29/4401 365/148 |
| 2013/0077426 A1 | 3/2013 | Abe et al. |
| 2017/0277633 A1 | 9/2017 | Wilkerson et al. |
| 2019/0180822 A1* | 6/2019 | Dunga .................. G11C 16/08 |

FOREIGN PATENT DOCUMENTS

WO 2014204661 A1 12/2014

OTHER PUBLICATIONS

International Search Report and Written Opinion for PCT Application No. PCT/US2021/042189 dated Nov. 1, 2021 (10 pages).

\* cited by examiner

*Primary Examiner* — Xiaochun L Chen
(74) *Attorney, Agent, or Firm* — Fletcher Yoder, P.C.

(57) ABSTRACT

Memory device systems and methods for using methods include multiple access lines arranged in a grid. Multiple memory cells are located at intersections of the access lines in the grid. Multiple drivers are included with each configured to transmit a corresponding signal to respective memory cells of the multiple memory cells. Remapping circuitry is configured to remap a near memory cell of the multiple memory cells to a far memory cell of the multiple memory cells. The near memory cell is relatively nearer to a respective driver of the multiple drivers than the far memory cell is to a respective driver of the multiple drivers.

19 Claims, 5 Drawing Sheets

ELECTRICAL DISTANCE-BASED REMAPPING IN A MEMORY DEVICE

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. Due to the different electrical properties of paths between the different intersections and drivers, the memory cells may react differently. For instance, near memory cells to the drivers may wear more quickly than far memory cells.

BRIEF DESCRIPTION OF THE DRAWINGS

Various aspects of this disclosure may better be understood upon reading the following detailed description and upon reference to the drawings in which.

DETAILED DESCRIPTION

Figure 1:
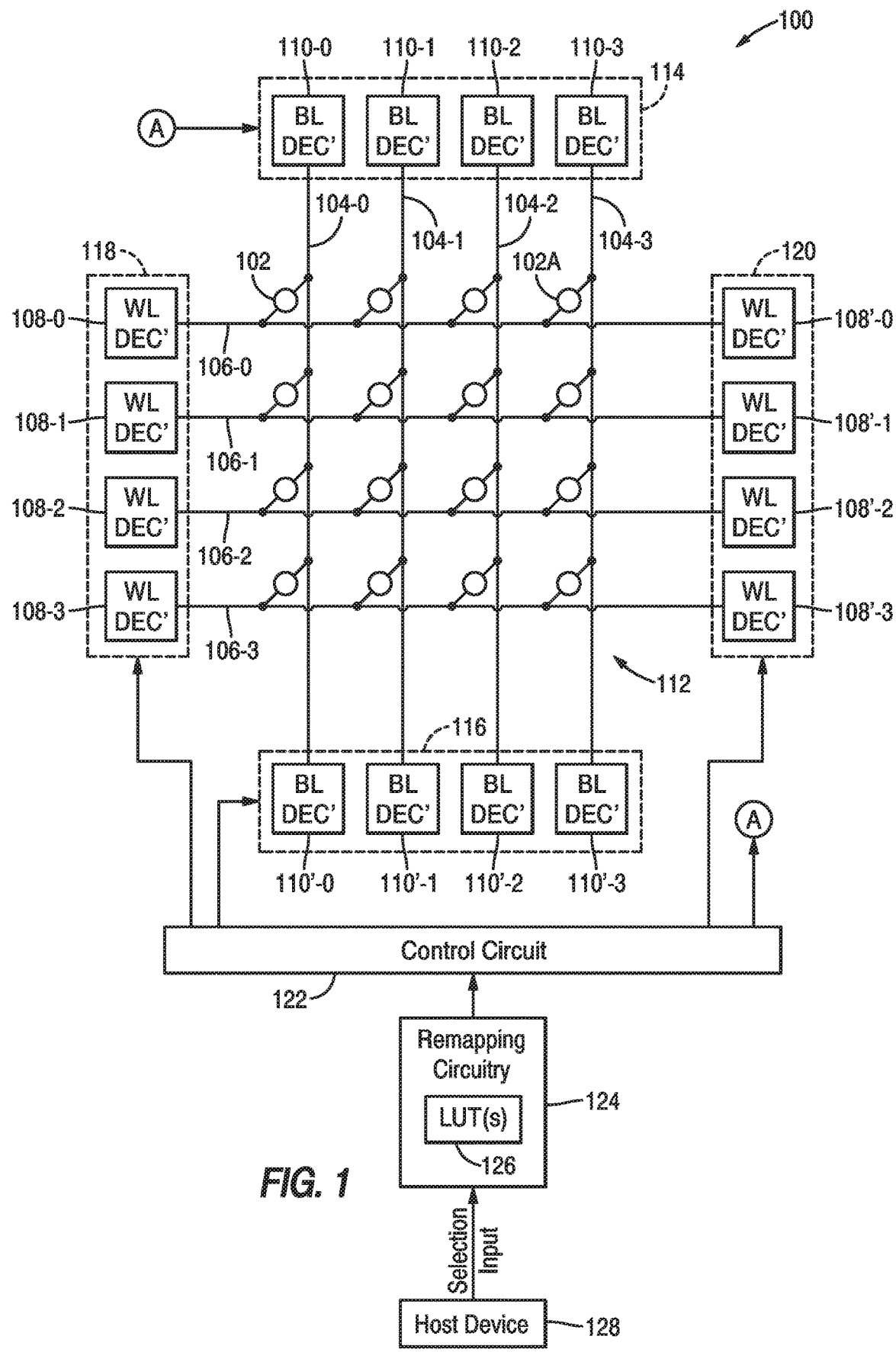
FIG. 1 is a simplified block diagram illustrating certain features of a memory device including a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. Some of the intersections may be relatively close to the wordline drivers and/or the bitline drivers while others of the intersections may be relatively far from the wordline drivers and/or the bitline drivers. The transmission lines between the drivers and the intersections may differ. For example, the differences may be related to parasitic capacitances in the transmission lines and/or resistances in the transmission lines. These different lengths and electrical parameters are referred to herein as an electrical distance (ED). Due to the difference in transmission lines between the close intersections and the far intersections, the different intersections may receive voltage and/or current transmissions from the drivers at different levels and/or with different waveshapes. These differences in waveshape may include different voltage/current values at the different intersections that may cause the close memory cells to undergo more stress with rapid current/voltage changes to which the far memory cells may not be subject. Accordingly, the close memory cells may wear more quickly than the far memory cells and/or may change electrical properties that slow response of the close memory cells.

To compensate for such uneven wear and/or response, the memory device may remap memory cells in locations susceptible to a high driving voltage/current based on an ED from the memory cell to one or more drivers. For example, the ED of each memory cell may be based on a distance from a wordline driver and/or a bitline driver used to drive the memory cell. Memory cells that are below a threshold distance from the wordline driver and/or the bitline driver may have corresponding addresses remapped to other memory cells (e.g., in a same region or in other regions of the memory device) that are less susceptible to higher voltages and/or premature wear. For instance, the cells to which the memory is remapped may be further away from the wordline and/or bitline drivers. The remapping may be performed by remapping circuitry that remaps from the near cells to other suitable cells. In some embodiments, this remapping may be transparent to a host device (e.g., processor) that sends data to the memory device. In embodiments where the memory cells that are remapped from are unavailable, the host device may merely view the memory device as having a reduced capacity than if each memory cell were configured to store different data.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

The memory device 100 may include remapping circuitry 124 that remaps at least some addresses to other addresses based on a selection input (e.g., memory address). The remapping circuitry 124 may be implemented using hardware, software, firmware, or a combination thereof. For instance, the remapping circuitry 124 may have one or more lookup tables (LUTs) 126 that store information regarding which memory addresses are to be remapped to other locations in the memory device 100. For instance, and as discussed below, memory cells 102 that are relatively close to respective wordline and/or bitline drivers may be remapped to other memory cells 102 with the LUTs 126 converting incoming addresses to remapped addresses. At least some of the remapping may be made before any remapping is performed. Additionally or alternatively, at least some remapping may be made on demand. For example, when an incoming request is made that corresponds to a memory cell 102 near a wordline and/or bitline driver, it may be remapped to an available memory cell 102 (e.g., closest or first available memory cell 102) that is not prone to near-driver issues. The LUTs 126 may store ED information related to the different locations of the memory cells 102. When an incoming request comes in for a memory cell 102 having an ED below a threshold (e.g., ED=2), the remapping circuitry 124 may substitute an address of a memory cell 102 with a higher ED (e.g., ED=10) and store the remapping to the LUTs 126.

For instance, if the memory cells 102 are grouped into multiple regions, some embodiments of the remapping circuitry 124 may remap memory cells 102 within the same region. Additionally or alternatively, the remapping circuitry 124 may map memory cells 102 from multiple regions into a remapping region that may be immune to some of the driving issues of the other regions. For instance, the remapping region may be relatively further from the wordline and bitline drivers than at least the region from which the memory cells 102 are being remapped. Furthermore, the remapping circuitry 124 may be adjusted during and/or after manufacture using an edit to the LUTs 126. Thus, if other drive compensation is added for the near memory cells 102, the remapping circuitry 124 may be used to reduce the aggressiveness of the remapping and/or disable remapping by editing the LUTs 126.

In some embodiments, the selection input may be received from a host device 128, such as a host processor reading data from the memory device 100. By performing conversions in the memory device 100, the remapping may be performed transparently with the host device 128 being unaware of the remapping. Instead, when remapping is enabled, via the remapping circuitry 124, the host device 128 may be notified that the memory device 100 has less available memory than if all memory cells 102 are used. Alternatively, the memory device 100 may send an indication (e.g., memory addresses/ranges) of unavailable memory cells 102 to the host device 128 to keep the host device 128 from using the unavailable memory cells 102 as a loss of capacity.

Furthermore, in some embodiments, this capacity loss may be at least partially mitigated by having the LUTs 126 reserve the near memory cells 102 until a threshold of memory cells 102 are being used. In such embodiments during periods of high usage, the LUTs 126 may make the unavailable memory cells 102 available again. Since the near memory cells 102 may be used only a fraction of the time when demand is high, the degradation of the near memory cells 102 may be limited even in such embodiments.

Figure 2:
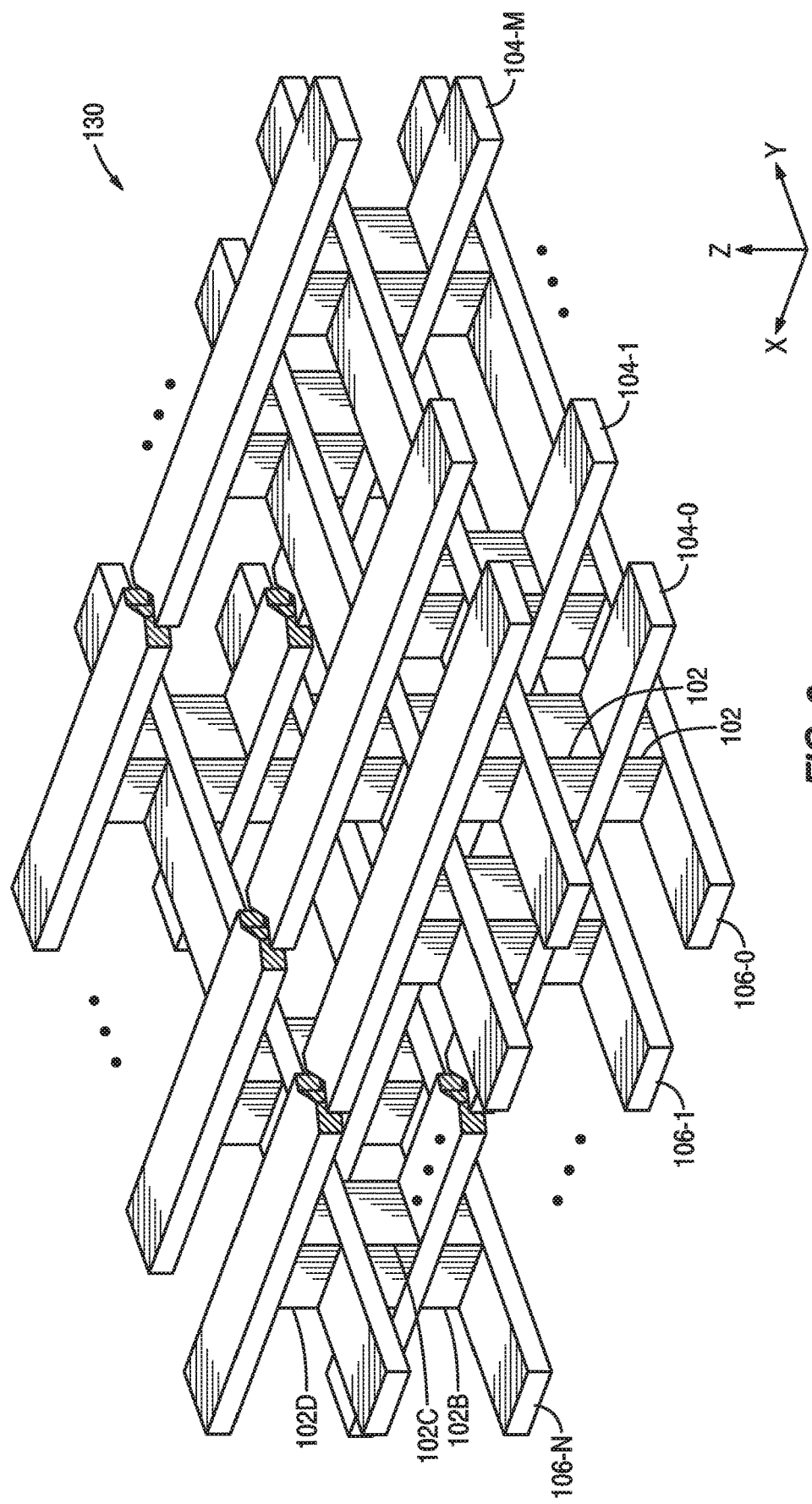
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of orthogonal lines. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

Figure 3:
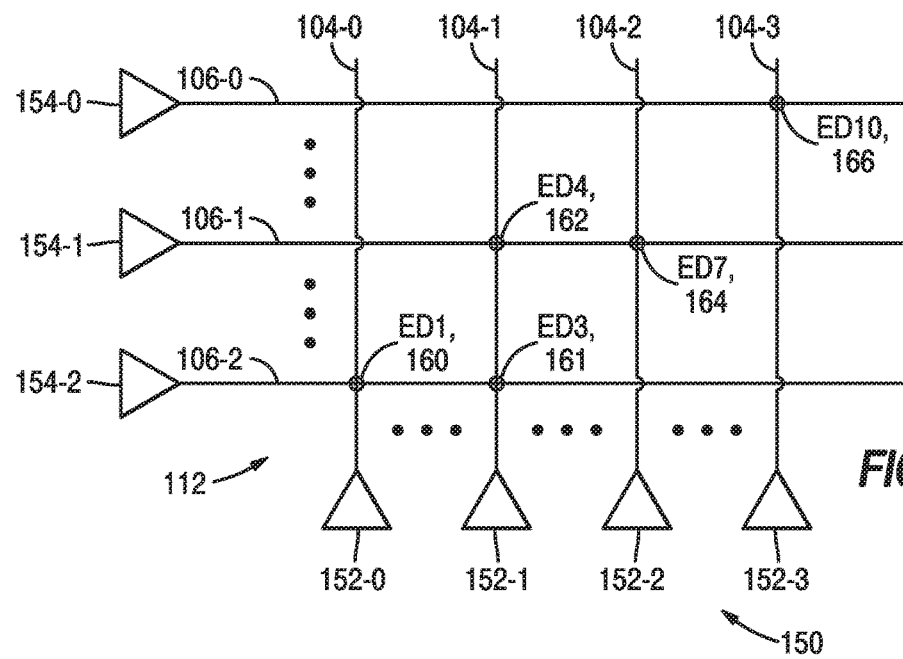
FIG. 3 is a simplified circuit diagram of the memory array of FIG. 1, according to an embodiment of the present disclosure.

FIG. 3 is a simplified diagram of a deck of a memory device 150 that may be an embodiment of the memory device 100. As previously discussed, at the intersections of the bitlines 104 and the wordlines 106 in the memory array 112, the memory cells 102 may be used to store information. However, the memory cells 102 have been omitted from FIG. 3 for simplicity. As illustrated each bitline 104 is driven by a respective bitline driver 152 (e.g., 152-0, 152-1, 152-2, 152-3, . . . , 152-K) and each wordline 106 is driven by a respective wordline driver 154 (e.g., 154-0, 154-1, 154-2, 154-3, . . . , 154-L). For instance, the bitline drivers 152 may include the bitline decoders 110 and/or may drive the bitlines 104 based on values decoded in the bitline decoders 110. Similarly, the wordline drivers 154 may include the wordline decoders 108 and/or may drive the wordlines 106 based on values decoded in the wordline decoders 108.

As may be appreciated, the memory array 112 may include various intersections, each with different electrical properties, such as resistances and/or parasitic capacitances at the different intersections. Based at least in part on the parasitic capacitance and/or resistance in the memory array 112, different intersections have a different electrical distance (ED) that causes different voltages and/or currents to be seen at different memory cells 102. In other words, voltages and/or currents seen at intersections 160, 161, 162, 164, and 166 may differ from each other even when the respective wordlines 106 and bitlines 104 are driven to the same value. Particularly, the intersection 160 may have less resistance (and parasitic capacitance) between the intersection 160 and the wordline driver 154-2 than the intersection 161 has between the intersection 161 and the wordline driver 154-2.

Figure 4:
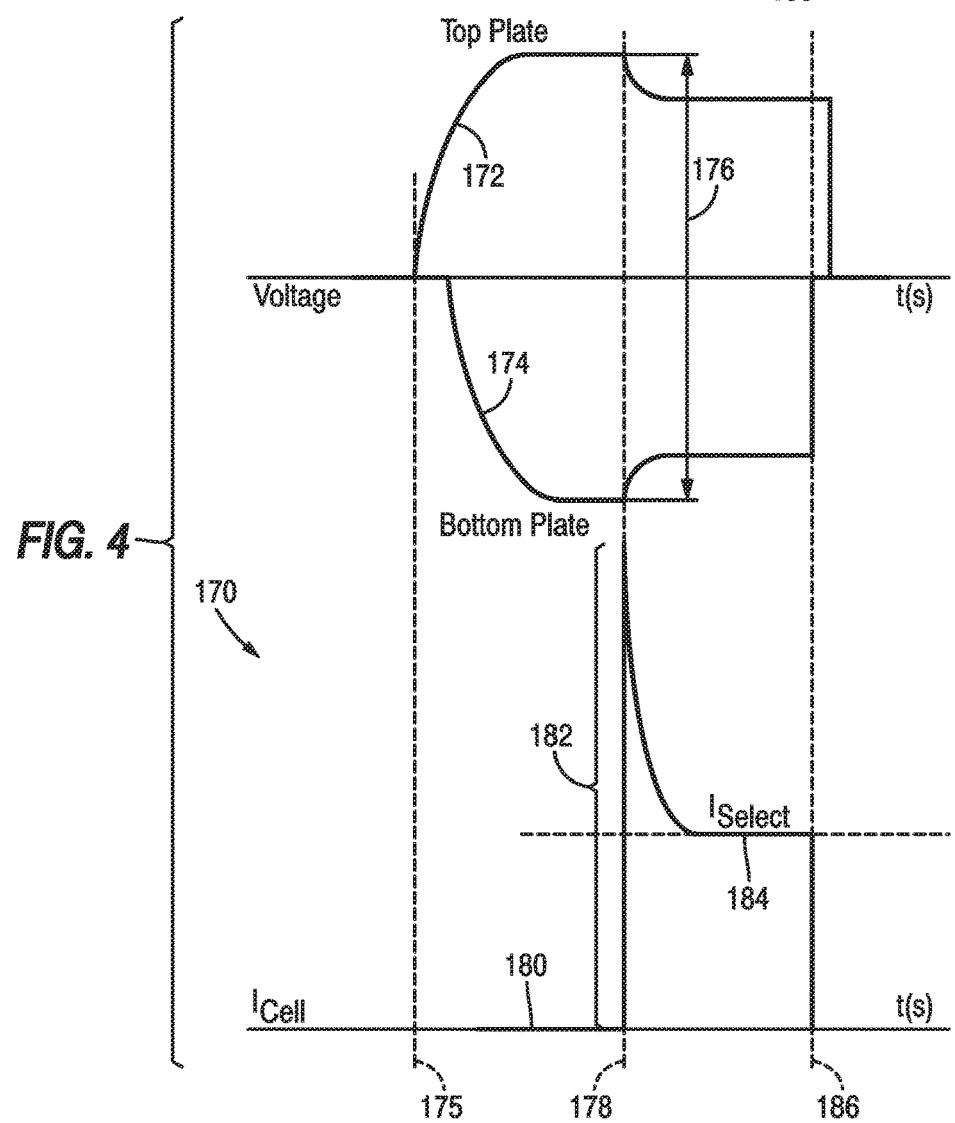
FIG. 4 is a graph of electrical voltages and currents in a memory cell of the memory array of FIG. 1, according to an embodiment of the present disclosure.

Based on the different electrical properties, the responses at the different intersections 160, 161, 162, 164, and 166 may differ. FIG. 4 illustrates a graph 170 showing electrical voltages and currents at a memory cell 102. As illustrated, a top plate voltage 172 may correspond to a voltage at a respective wordline 106 at the respective intersection. A bottom plate voltage 174 may correspond to a voltage at a respective bitline 104 at the respective intersection. To turn-on the memory cell 102, the memory cell 102 crosses a threshold voltage. To cross this threshold, after a time 175, the top plate voltage 172 increases and the bottom plate voltage 174 decreases. In some embodiments, a single voltage may change to turn on the memory cell 102.

As the voltage difference 176 increases, the capacitances of the wordline 106 and the bitline 104 accumulate charge. After the voltage difference 176 increases to an amount greater than or equal to the threshold for a period, the memory cell 102 turns on, and a current 180 begins flowing through the memory cell 102. However, due to the accumulation of charge on the wordline 106 and the bitline 104, a rush current spike 182 discharges through the memory cell 102. With lower resistances between the respective intersection and the respective wordline driver 154 and/or bitline driver 152 for lower EDs, the intersections with a lower ED may be exposed to a greater rush current magnitude than rush currents at intersections with higher EDs. The magnitude of the rush current impacts the characteristics of the respective memory cell 102. For instance, these characteristics may include changes in threshold voltages and/or endurance of the memory cell 102. Due to this difference in characteristics based on the distance of the memory cells 102 from the respective wordline driver 154 and/or bitline driver 152, the memory cells 102 may behave differently based on their ED from the respective wordline driver 154 and/or bitline driver 152. This variance in behavior of the memory cells 102 may impact the overall read window budget (RWB) for the memory device 100 and/or how long the memory device 100 functions as designed.

When the charge dissipates, the current 180 drops to a selection current level 184. After a turn off point 186, the top plate voltage 172, the bottom plate voltage 174, and the current 180 return to their initial off states.

Figure 5:
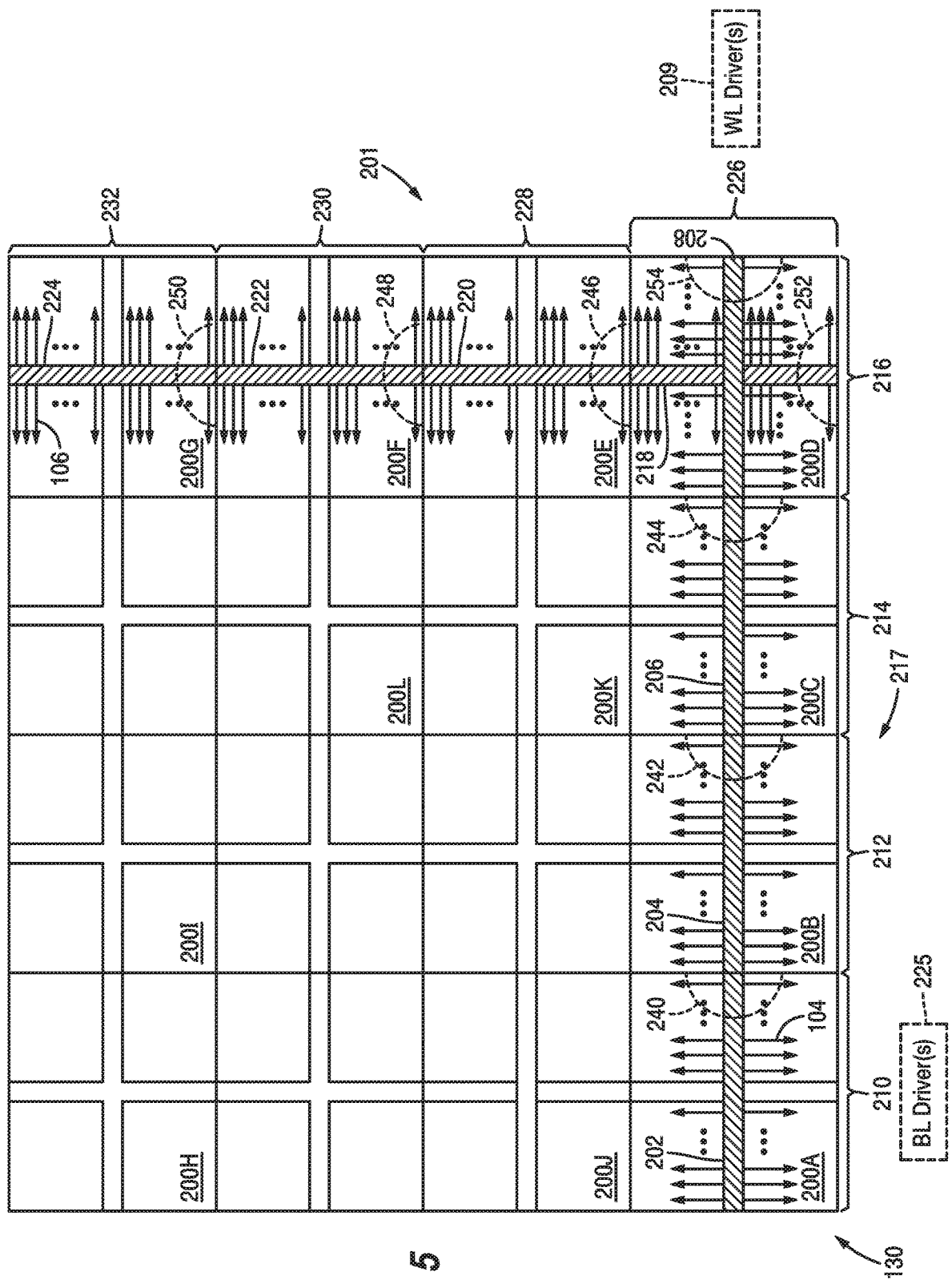
FIG. 5 is a diagram of the regions of memory cells in the memory array of FIG. 1 with wordlines and bitlines in an arrangement being driven in rows and columns in the memory array, according to an embodiment of the present disclosure.

The memory cells 102 may be organized into groups of memory cells 102 that share at least a portion of routing and/or electrical properties with other memory cells 102. FIG. 5 illustrates a diagram of one embodiment of the memory array 130. The memory cells 102 are located into regions 200 (e.g., 200A, 200B, 200C, 200D, 200E, 200F, 200G, 200H, 200I, 200J, 200K, 200L, etc.). The regions 200 may have wordlines 106 that are driven from a first side 201 of the memory array 130. The driving of the wordlines 106 may be made via local drivers 202, 204, 206, and 208 for columns 210, 212, 214, and 216. The local drivers 202, 204, 206, and 208 may be driven by one or more edge-located WL drivers 209.

Similar to the wordlines 106, the regions 200 may have bitlines 104 that are driven from a second side 217 of the memory array 130. The driving of the bitlines 104 may be made via local drivers 218, 220, 222, and 224 for rows 226, 228, 230, and 232. The local drivers 218, 220, 222, and 224 may be driven by one or more edge-located BL drivers 225.

Within the regions 200, sub-groups of memory cells 102 may have common EDs that indicate that the memory cells 102 are susceptible to a similar rush current magnitude. Memory cells 102 located at intersections susceptible to rush current magnitudes above a threshold value may be designated as part of sub-groups 240, 242, 244, 246, 248, and 250. For instance, the memory cells 102 in the sub-groups 240, 242, 244, 246, 248, and 250 may have EDs greater than a threshold based on physical distances to the WL drivers 209 and the BL drivers 225 via respective local drivers 202, 204, 206, 220, 222, and 224. The physical distance may be relative within each group for the respective local drivers 202, 204, 206, 220, 222, and 224 specifically, the rush current magnitude may incrementally decrease at the memory cells 102 moving across the respective local drivers 202, 204, 206, 220, 222, and 224 away from the respective first side 201 and second side 217. For instance, the region 200A may include a sub-group 240 that may be susceptible to a rush current above a threshold, the region 200B may include a sub-group 242 that may be susceptible to a rush current above a threshold, the region 200C may include a sub-group 244 that may be susceptible to a rush current above a threshold, the region 200E may include a sub-group 246 that may be susceptible to a rush current above a threshold, the region 200F may include a sub-group 248 that may be susceptible to a rush current above a threshold, and the region 200G may include a sub-group 244 that may be susceptible to a rush current above a threshold. In some embodiments, at least one entire region (e.g., region 200D) may be completely remapped.

When the remapping circuitry 124 remaps the one or more memory cells 102, the remapping circuitry 124 may receive a memory address and may compute the new mapped addresses on the fly as commands come in when commands are decoded. The mapped addresses may be sent to the memory array 130. This remapping may be performed in real time without greatly impacting the throughput requirements of the memory device 100. This remapping scheme may also be applied relatively easily applied for multiple decks to the memory device 100.

When remapping, the memory cell 102 may be remapped to a region (e.g., 200H and 200I) that is further from the first side 201 and/or the second side 217 than the region from which the memory cell 102 is being remapped. Indeed, some of the further regions (e.g., 200H or 200I) may have no memory cells 102 having an ED below the threshold (e.g., ED less than or equal to 1) leaving such regions 200 to be immune to the rush current issues previously discussed. Additionally or alternatively to remapping to "safe" regions, memory cells 102 in a region (e.g., 200A) may be remapped within the region outside of the respective sub-region (e.g., 240) potentially susceptible to relatively high magnitude rush currents if such memory cells 102 are available.

The sub-groups 240, 242, 244, 246, 248, and 250, and any other sub-groups, may have any suitable shape to encompass the memory cells 102 that may experience the rush current spike 182 above a permissible threshold (e.g., based on a calculation of ED for the respective memory cells 102). For instance, the sub-groups 240, 242, 244, 246, 248, and 250, and other sub-groups, may be shaped in a semi-circular shape, a triangular shape, a rectangular shape, an irregular shape, or any other suitable shape. Furthermore, the sub-groups 240, 242, 244, 246, 248, and 250 may have a single general shape or may have different shapes based on the different EDs. Furthermore, the sub-groups 240, 242, 244, 246, 248, and 250 may have a uniform size for each region 200, or the sub-groups 240, 242, 244, 246, 248, and 250 may have different sizes. For instance, the sub-groups 240, 242, 244, 246, 248, and 250 closer to the first side 201 and/or the second side 217 may have larger sizes while those further from the sub-groups 240, 242, 244, 246, 248, and 250 may have smaller sizes.

Figure 6:
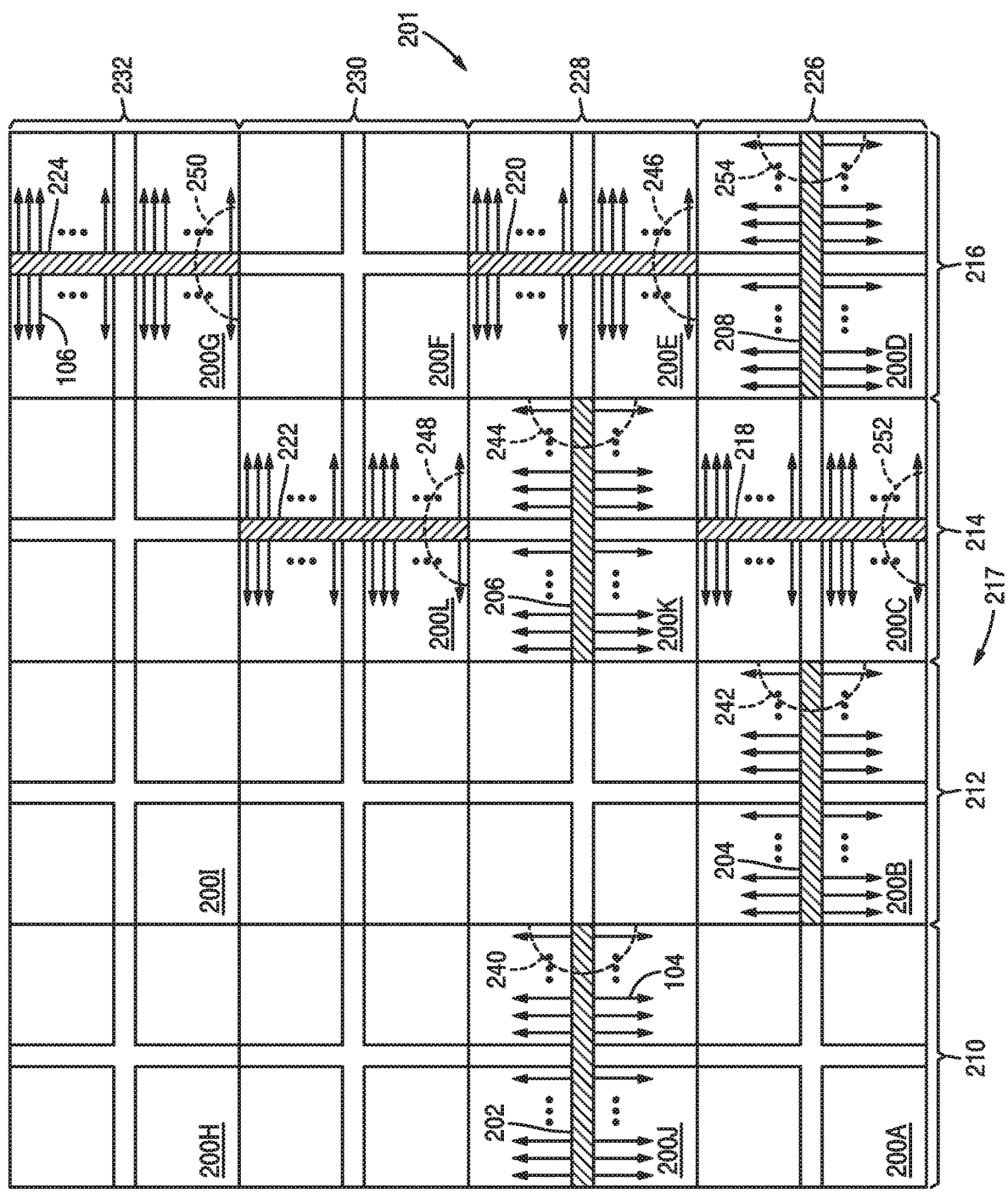
FIG. 6 is a diagram of the regions of memory cells in the memory array of FIG. 1 with wordlines and bitlines in an alternative arrangement being driven in rows and columns in the memory array, according to an embodiment of the present disclosure.

The memory array 130 may have different arrangements than the one shown in FIG. 5. For instance, FIG. 6 illustrates an alternative arrangement of the memory array 130 with no more than a single local driver in a region 200 to interleave the local drivers 202, 204, 206, 208, 218, 220, 222, and 224. As illustrated in FIG. 5, the local drivers 202, 206, 218, and 222 (along with the related sub-groups 240, 244, and 218) have been relocated to respective regions 200J, 200K, 200C, and 200L. Additionally, the local drivers 208 and 218 may be separated from each other each having its own sub-groups 252 and 254. Although the arrangement in FIG. 6 may be different than FIG. 5, the remapping circuitry 124 may remap from the sub-groups 240, 242, 244, 246, 248, 250, 252, and 254 using any of techniques previously discussed. Indeed, the memory array 130 may be driven in any other suitable arrangement, and the remapping circuitry 124 may remap memory cells 102 that may be subject to a rush current spikes above threshold magnitude regardless of arrangement.

Technical effects of the present disclosure include systems and methods that enable memory cells that may be susceptible to degradation due to rush current spikes to be remapped to other memory cells. Although such remapping may reduce capacity of the memory device, the tradeoff of capacity may be compensated for by earlier ship dates and meeting product quality requirements.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. A device, comprising:
a plurality of access lines arranged in a grid;

a plurality of memory cells located at intersections of the access lines in the grid;

a plurality of drivers, each configured to transmit a corresponding signal to respective memory cells of the plurality of memory cells; and remapping circuitry configured to remap a near memory cell of the plurality of memory cells to a far memory cell of the plurality of memory cells, wherein the near memory cell is relatively nearer to a respective driver of the plurality of drivers than the far memory cell is to a respective driver of the plurality of drivers, wherein the near memory cell is more susceptible to a first current rush spike above a current rush spike threshold when the near memory cell is turned on than the far memory cell is susceptible to a second current rush spike above the current rush spike threshold when the far memory cell is turned on.

2. The device of claim 1, wherein the access lines comprise bitlines and wordlines.

3. The device of claim 2, wherein the near memory cell has an electrical distance from a bitline driver below a threshold value, wherein the bitline driver is configured to drive the bitline for the near memory cell.

4. The device of claim 2, wherein the near memory cell has an electrical distance from a wordline driver below a threshold value, wherein the wordline driver is configured to drive the wordline for the near memory cell.

5. The device of claim 2, wherein the near memory cell has an electrical distance reflecting respective distances of the near memory cell from a wordline driver and from a bitline driver, wherein the electrical distance is below a threshold value.

6. The device of claim 2, wherein the remapping circuitry comprises a lookup table, wherein at least some of the plurality of memory cells have an electrical distance from a respective wordline driver or from a respective bitline driver, wherein the respective electrical distances are stored in the lookup table.

7. The device of claim 1, wherein the remapping circuitry comprises a lookup table configured to:
receive a first indicator of the near memory cell; and
output a second indicator of the far memory cell.

8. The device of claim 7, wherein the first indicator comprises a memory address of the near memory cell.

9. The device of claim 7, wherein the second indicator comprises a memory address of the far memory cell.

10. The device of claim 7, wherein the first indicator comprises a memory address of the far memory cell.

11. The device of claim 7, wherein receiving the first indicator comprises receiving the first indicator from a host device without sending the second indicator to the host device.

12. A method, comprising:
receiving, at remapping circuitry, an indication of a memory cell of a plurality of memory cells of a memory device, wherein the plurality of memory cells are distributed in a memory array at a plurality of intersections of wordlines and bitlines of the memory device, wherein the indication provides that the memory cell is to-be-accessed and is located at a particular intersection of the wordlines and the bitlines;
determining, using the remapping circuitry, that the memory cell is susceptible to a rush current spike above a rush threshold value; and
remapping, using the remapping circuitry, the memory cell to another memory cell based at least in part on the determination that the memory cell is susceptible to the rush current spike being above the rush threshold value when the memory cell is turned on.

13. The method of claim 12, wherein determining that the memory cell is susceptible to the rush current spike above the rush threshold value comprises determining whether a distance is within a distance threshold, wherein the distance comprises a bitline distance for the memory cell from a bitline driver to a respective intersection for the memory cell or a wordline distance for the memory cell from a wordline driver to the respective intersection for the memory cell.

14. The method of claim 13, wherein determining whether the distance is within the distance threshold comprises looking up the distance in a lookup table of the remapping circuitry based at least in part on the indication.

15. The method of claim 14, wherein the indication comprises a memory address for the memory cell.

16. The method of claim 14, wherein remapping the memory cell to the other memory cell comprises outputting, from the remapping circuitry, a memory address for the other memory cell.

17. A memory device, comprising:
a plurality of bitlines arranged in parallel to each other in a plurality of regions of the memory device;
a plurality of wordlines arranged parallel to each other and perpendicular to the plurality of bitlines in the plurality of regions of the memory device;
a plurality of memory cells located at intersections of the plurality of bitlines and the plurality of wordlines in the plurality of regions;
a plurality of local drivers configured to drive the plurality of memory cells via the plurality of wordlines and the plurality of bitlines; and
a mapping circuitry configured to
receive an address of a memory cell of the plurality of memory cells;
determine that the memory cell is within a threshold distance of a respective local driver of the plurality of local drivers; and
remap the address to an address of another memory cell of the plurality of memory cells based at least in part on the determination that the memory cell is within the threshold distance of the respective local driver.

18. The memory device of claim 17, wherein the respective local driver, the memory cell, and the other memory cell are located within a region of the plurality of regions.

19. The memory device of claim 17, wherein the respective local driver and the memory cell are located within a first region of the plurality of regions, and the other memory cell located in a second region of the plurality of regions, wherein the second region contains none of the plurality of local drivers.

* * * * *